(12) United States Patent
Nishimura

(10) Patent No.: US 8,482,061 B2
(45) Date of Patent: Jul. 9, 2013

(54) SEMICONDUCTOR DEVICE AND THE METHOD OF MANUFACTURING THE SAME

(75) Inventor: Takeyoshi Nishimura, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 55 days.

(21) Appl. No.: 13/067,575

(22) Filed: Jun. 9, 2011

(65) Prior Publication Data

US 2011/0303925 A1    Dec. 15, 2011

(30) Foreign Application Priority Data

Jun. 10, 2010  (JP) .................. 2010-133366

(51) Int. Cl.
    *H01L 29/66* (2006.01)
(52) U.S. Cl.
    USPC 257/330; 257/77; 257/E29.262; 257/E21.334
(58) Field of Classification Search
    USPC .............. 257/330, 77, E29.262, E21.334
    See application file for complete search history.

(56) References Cited

U.S. PATENT DOCUMENTS

| 5,998,833 A | 12/1999 | Baliga |
| 6,693,728 B1 | 2/2004 | Kinoshita et al. |
| 7,005,351 B2 | 2/2006 | Henninger et al. |
| 2004/0094798 A1 | 5/2004 | Hara et al. |
| 2008/0042172 A1 | 2/2008 | Hirler et al. |

FOREIGN PATENT DOCUMENTS

| JP | 2002-026324 A | 1/2002 |
| JP | 2007-087985 A | 4/2007 |
| JP | 4028333 | 10/2007 |
| JP | 2008-103683 A | 5/2008 |

*Primary Examiner* — Kimberly Rizkallah
*Assistant Examiner* — Timor Karimy
(74) *Attorney, Agent, or Firm* — Rabin & Berdo, P.C.

(57) ABSTRACT

A semiconductor device according to the invention includes p-type well region 3 and n⁺ source region 4, both formed selectively in the surface portion of n⁻ drift region 2; trench 6 in contact with n⁺ source region 4 and extending through p-type well region 3 into n⁻ drift region 2; field plate 8 formed in trench 6 with first insulator film 7 interposed between the trench 6 inner surface and field plate 8; gate electrode 10 formed in trench 6 with second insulator film 9 interposed between the trench 6 side wall and gate electrode 10, gate electrode 10 being formed above field plate 8; first insulator film 7 being thicker than second insulator film 9; and n⁻⁻ lightly doped region 21 in n⁻ drift region 2, n⁻⁻ lightly doped region 21 crossing under the bottom surface of trench 6 from the corner portion thereof, n⁻⁻ lightly doped region 21 covering the bottom surface of trench 6.

The semiconductor device according to the invention and the method of manufacturing the semiconductor device according to the invention facilitate lowering the ON-state voltage, preventing the breakdown voltage from lowering, lowering the gate capacitance, and reducing the manufacturing costs.

5 Claims, 8 Drawing Sheets

SEMICONDUCTOR DEVICE AND THE METHOD OF MANUFACTURING THE SAME

FIELD OF THE INVENTION

The present invention relates to semiconductor devices and the method of manufacturing the semiconductor devices.

BACKGROUND

As one of the metal-oxide-semiconductor field-effect transistors (hereinafter referred to as the "MOSFET's") having a trench-structure, a MOSFET having a field-plate structure including a field plate biased at a source potential and formed in the bottom of a trench, in which a gate electrode is formed, is known to the persons skilled in the art. Hereinafter, the field-plate structure described above will be referred to as a "vertical field-plate structure". By providing a MOSFET with the vertical field-plate structure, the breakdown voltage will be lowered hardly, even if the impurity concentration in the drift region is high. Therefore, the ON-state voltage is reduced and the gate capacitance (parasitic capacitance) is reduced.

FIG. 16 is the cross sectional view of a conventional MOSFET having a vertical field-plate structure (hereinafter referred to as a "vertical-field-plate-type MOSFET").

In the vertical-field-plate-type MOSFET shown in FIG. 16, $n^-$ drift region 102 is formed on $n^+$ drain region 101. In $n^-$ drift region 102, an active area and an edge-termination area (not shown) surrounding the active area are formed. The edge-termination area functions to improve the breakdown voltage of the active area.

In the surface portion in the active area of $n^-$ drift region 102, p-type well region 103 is formed. In the surface portion of p-type well region 103, $n^+$ source region 104 and $p^+$ heavily doped region 105 are formed selectively. Trench 106 is formed through $n^+$ source region 104 and p-type well region 103. Trench 106 is extended into $n^-$ drift region 102. In trench 106, field plate 108 is disposed with insulator film 107 interposed between field plate 108 and the trench 106 inner wall. Field plate 108 is connected electrically to a source electrode. In trench 106, gate electrode 110 is disposed above field plate 108 with gate insulator film 109 interposed between gate electrode 110 and the trench 106 side wall.

Field plate 108 is positioned on the $n^-$ drift region 102 side of the boundary between $n^-$ drift region 102 and p-type well region 103. Field plate 108 is insulated from gate electrode 110 by a first interlayer insulator film. Source electrode 112 is in contact with $n^+$ source region 104 and $p^+$ heavily doped region 105. Source electrode 112 is insulated from gate electrode 110 by second interlayer insulator film 111. Drain electrode 113 is disposed on an $n^+$ drain region 101 surface opposite to the $n^+$ drain region 101 surface, on which $n^-$ drift region 102 is formed. Drain electrode 113 is in contact with $n^+$ drain region 101.

The following Patent Documents 1 and 2 propose vertical-field-plate-type MOSFET's as described below. The proposed vertical-field-plate-type MOSFET's include a GD-UMOSFET (graded-doped U-shape MOSFET) unit cell that includes an upper trench-based gate electrode and a lower trench-based source electrode. The use of the trench-based source electrode instead of a large gate electrode which occupies the entire trench reduces the gate-to-drain capacitance ($C_{GD}$) of the UMOSFET and thereby improves the switching speed by reducing the amount of gate charging and discharging current that is needed during high-frequency operations.

A MOSFET obtained by providing the drift region of the vertical-field-plate-type MOSFET (cf. FIG. 16) with a double-layer structure (not shown) is well known to the persons skilled in the art. In the double-layer structure, the impurity concentration in the drift region on the p-type well region side of the trench corner is set to be higher than the impurity concentration in the drift region on the drain region side of the trench corner. By providing the drift region with the double-layer structure as described above, the ON-state voltage is further reduced on the p-type well region side in the drift region. Moreover, the electric field is relaxed in the vicinity of the trench bottom surface, to which the electric field is liable to localization, on the drain region side in the drift region. Therefore, the breakdown voltage in the active area is prevented from lowering.

The following Patent Document 3 proposes a semiconductor device as described below that reduces the gate capacitance and improves the breakdown voltage.

The semiconductor device proposed in the Patent Document 3 includes a silicon wafer of a first conductivity type; trenches formed into the top surface of the wafer with a certain spacing between the trenches, the trench extending to a predetermined depth; an insulator coating lining the side wall and bottom of the trench; an electrically conductive gate body filling the trench; a channel region of a second conductivity type extending into the top of the wafer to a first depth shallower than the predetermined depth; a source region of the first conductivity type extending into the channel region to a second depth from the top of the wafer to define an invertable channel along the side of the trench in the channel region which extends between the first and second depths; a source electrode formed on the top surface of the wafer and connected to the source and channel regions; a drain electrode connected to the bottom of the wafer; and a shallow diffusion of the second conductivity type surrounding the bottom of the trench.

The shallow diffusion is doped more lightly than the channel region substantially. The shallow diffusion is depleted at all times by the built-in junction voltage at the junction thereof to the surrounding wafer material of the first conductivity type.

The following Patent Document 4 proposes a device as described below. The device proposed in the Patent Document 4 includes a first main electrode; a second main electrode; a drain region of a second conductivity type connected to the second main electrode; an epitaxial region of the second conductivity type on the drain region; a semiconductor base region of a first conductivity type above the epitaxial region; a trench formed through the semiconductor base region; a gate electrode in the trench with an insulator film interposed between the gate electrode and the inner wall of the trench; a source region of the second conductivity type formed in the surface portion of the semiconductor base region and in contact with the trench, the source region being connected to the first main electrode; a semiconductor region of the second conductivity type between the semiconductor base region and the epitaxial region; and a semiconductor region of the first conductivity type between the semiconductor region of the second conductivity type and the epitaxial region, the semiconductor region of first conductivity type being in contact with the semiconductor region of the second conductivity type.

In the device proposed in the Patent Document 4, the current flow between the first and second main electrodes caused by a voltage applied in a predetermined direction between the first and second main electrodes is controllable by a voltage applied to the gate electrode. In the state, in which the voltage applied in the predetermined direction is zero, the semiconductor region of the second conductivity type and the semiconductor region of first conductivity type are depleted completely. By the expansion of the depleted region to the surrounding of the trench bottom, the capacitance between the drain and source and the capacitance between the drain and gate are reduced.

The following Patent Document 5 proposes a device as described below. The device proposed in the Patent Document 5 includes a semiconductor substrate of a first conductivity type; a semiconductor layer of the first conductivity type on the semiconductor substrate, the semiconductor layer working as a drain region; a channel layer of a second conductivity type opposite to the first conductivity type formed on the semiconductor layer; a trench extending through the channel layer into the semiconductor layer; an insulator film on the inner wall of the trench; a gate electrode buried in the trench; a source region of the first conductivity type formed in the surface portion of the channel layer and in adjacent to the trench; and a lightly doped impurity region of the first conductivity type in the semiconductor layer, in which the bottom of the trench is positioned.

The following Patent Document 6 proposes a semiconductor device that relaxes the electric field in the vicinity of the trench bottom surface and prevents the breakdown voltage from lowering. The semiconductor device proposed in the Patent Document 6 includes a semiconductor body. The semiconductor body includes a first surface; a second surface; an internal region; an edge region in adjacent to the internal region; a first semiconductor layer of a first conductivity type extending through the internal region to the edge region; and one or more functional device zones of a second conductivity type complementary to the first conductivity type, the one or more functional device zones being in the internal region in the first semiconductor layer; and an edge structure positioned in the edge region.

DOCUMENTS DESCRIBING THE PRIOR ARTS

Patent Documents

[Patent Document 1] U.S. Pat. No. 5,998,833
[Patent Document 2] U.S. Pat. No. 7,005,351
[Patent Document 3] Japanese Unexamined Patent Application Publication No. 2002-026324
[Patent Document 4] Japanese Patent Publication No. 4028333
[Patent Document 5] Japanese Unexamined Patent Application Publication No. 2007-087985
[Patent Document 6] Japanese Unexamined Patent Application Publication No. 2008-103683

For providing the drift region in the vertical-field-plate-type MOSFET as described above (cf. FIG. 16) with a double-layer structure, it is necessary to laminate two epitaxial layers in the drift region (double-layer epitaxial structure) or to form a deep diffusion layer in the surface portion of the drift region so that the impurity concentration in the drift region on the p-type well region side may be higher than the impurity concentration in the drift region on the drain region side.

If the drift region is provided with a double-layer structure, the impurity concentration in the surface portion of the drift region in the edge-termination area will be high and the breakdown voltage in the edge-termination area will be lowered as compared with the breakdown voltage in the active area. Therefore, the breakdown voltage of the entire vertical-field-plate-type MOSFET will be lowered. For obtaining a certain breakdown voltage in the edge-termination area, it is necessary to design a new edge-termination structure.

If an epitaxial layer is buried selectively only in the drift region in the active area to provide only the drift region in the active area with a double-layer structure or if a patterning is conducted to form a deep diffusion layer only in the drift region in the active area, the breakdown voltage of the edge-termination area may be sustained by the conventional edge-termination structure. However, the techniques described above increase the manufacturing costs of the wafer, in which a vertical-field-plate-type MOSFET is formed. In addition, crystal defects increase in the drift region and the electric characteristics of the vertical-field-plate-type MOSFET are impaired.

In view of the foregoing, it is a first object of the invention to obviate the problems described above. It is a second object of the invention to provide a semiconductor device that exhibits a low ON-state voltage and to provide the manufacturing method of the semiconductor device. It is a third object of the invention to provide a semiconductor device and the manufacturing method thereof which facilitate preventing the breakdown voltage of the semiconductor device from lowering. It is a fourth object of the invention to provide a semiconductor device that exhibits low gate capacitance and to provide the manufacturing method of the semiconductor device. It is a fifth object of the invention to provide a semiconductor device and the manufacturing method thereof which facilitate reducing the manufacturing costs of the semiconductor device.

SUMMARY OF THE INVENTION

According to the subject matter of the appended claim 1, there is provided a semiconductor device including;

a first semiconductor region of a first conductivity type;

a second semiconductor region of a second conductivity type formed in the surface portion of the first semiconductor region;

a third semiconductor region of the first conductivity type formed selectively in the surface portion of the second semiconductor region;

a trench in contact with the third semiconductor region, the trench extending through the second semiconductor region into the first semiconductor region;

a first electrode formed in the trench with a first insulator film interposed between the side wall of the trench and the first electrode, the first electrode being formed on the side of the bottom surface of the trench;

a control electrode formed in the trench with a second insulator film interposed between the side wall of the trench and the control electrode, the control electrode being formed above the first electrode;

a second electrode in contact with the second semiconductor region and the third semiconductor region;

a fourth semiconductor region of the first conductivity type covering the corner portion of the trench, the fourth semiconductor region being doped more lightly than the first semiconductor region;

the first electrode being positioned on the first semiconductor region side of the boundary between the first semiconductor region and the second semiconductor region;

the first electrode being connected electrically to the second electrode; and the first insulator film being thicker than the second insulator film.

According to the subject matter of the appended claim 2, the fourth semiconductor region crosses under the bottom surface of the trench from the corner portion of the trench such that the fourth semiconductor region covers the bottom surface of the trench.

According to the subject matter of the appended claim 3, the impurity concentration in the fourth semiconductor region is 20% or more and 88% or less of the impurity concentration in the first semiconductor region.

According to the subject matter of the appended claim 4, there is provided a semiconductor device including;

a first semiconductor region of a first conductivity type;

a second semiconductor region of a second conductivity type formed in the surface portion of the first semiconductor region;

a third semiconductor region of the first conductivity type formed selectively in the surface portion of the second semiconductor region;

a trench in contact with the third semiconductor region, the trench extending through the second semiconductor region into the first semiconductor region;

a first electrode formed in the trench with a first insulator film interposed between the side wall of the trench and the first electrode, the first electrode being formed on the side of the bottom surface of the trench;

a control electrode formed in the trench with a second insulator film interposed between the side wall of the trench and the control electrode, the control electrode being formed above the first electrode;

a second electrode in contact with the second semiconductor region and the third semiconductor region;

a fifth semiconductor region of the first conductivity type doped more heavily than the first semiconductor region; the fifth semiconductor region being formed in the portion of the first semiconductor region positioned on the second semiconductor region side of the corner portion of the trench;

the first electrode being positioned on the first semiconductor region side of the boundary between the first semiconductor region and the second semiconductor region;

the first electrode being connected electrically to the second electrode; and the first insulator film being thicker than the second insulator film.

According to the subject matter of the appended claim 5, the fifth semiconductor region is in adjacent to the first electrode and the control electrode via the first insulator film and the second insulator film formed on the side wall of the trench.

According to the subject matter of the appended claim 6, the impurity concentration in the fifth semiconductor region is 114% or more and 500% or less of the impurity concentration in the first semiconductor region.

According to the subject matter of the appended claim 7, the semiconductor device includes a silicon substrate working as the first semiconductor region.

According to the subject matter of the appended claim 8, the semiconductor device includes a silicon carbide substrate working as the first semiconductor region.

The method of manufacturing a semiconductor device according to the subject matter of the appended claim 9 has the following specific features.

First, a trench is formed in a first semiconductor region of a first conductivity type such that the angle between the bottom surface of the trench and the corner portion of the trench is obtuse. Then, an oxide film having an arbitrary thickness is formed and an impurity of a second conductivity type is introduced into the surface portion of the first semiconductor region. Based on the angle to the trench corner, the thickness of the oxide film formed, the concentration of the impurity of the second conductivity type, the ion implantation angle, and the acceleration voltage of the ion implantation, the concentration of the impurity of the first conductivity type in the surface portion of the first semiconductor region exposed to the corner portion of the trench is set to be low selectively.

After the step of introducing an impurity described above, a first electrode is formed in the trench with a first insulator film interposed between the side wall of the trench and the first electrode. Then, a control electrode is formed in the trench with a second insulator film interposed between the side wall of the trench and the control electrode. The control electrode is formed above the first electrode. Then, the impurity of the second conductivity type introduced into the surface portion of the first semiconductor region is diffused to form a fourth semiconductor region of the first conductivity type which is doped more lightly than the first semiconductor region and covering the corner portion of the trench.

According to the subject matter of the appended claim 10, the angle between the bottom surface of the trench and the corner portion of the trench is 120 degrees of angle or wider and 150 degrees of angle or narrower.

According to the subject matter of the appended claim 11, impurity ions of the second conductivity type are implanted at an oblique angle between 65 degrees of angle and 80 degrees of angle to the surface of the first semiconductor region in the step (b).

The method of manufacturing a semiconductor device according to the subject matter of the appended claim 12 has the following specific features.

First, a trench is formed in a first semiconductor region of a first conductivity type. Then, an oxide film having an arbitrary thickness is formed and an impurity of a second conductivity type is introduced into the surface portion of the first semiconductor region. Based on the thickness of the oxide film formed, the concentration of the impurity of the second conductivity type, and the acceleration voltage of the ion implantation, the concentration of the impurity of the first conductivity type in the surface portion of the first semiconductor region exposed to the bottom surface of the trench is set to be low selectively.

After the step of introducing an impurity described above, a first electrode is formed in the trench with a first insulator film interposed between the side wall of the trench and the first electrode. Then, a control electrode is formed in the trench with a second insulator film interposed between the side wall of the trench and the control electrode. The control electrode is formed above the first electrode.

Then, the impurity of the second conductivity type introduced into the surface portion of the first semiconductor region is diffused to form a fourth semiconductor region of the first conductivity type which is doped more lightly than the first semiconductor region. The fourth semiconductor region crosses under the bottom surface of the trench from the corner portion thereof. The fourth semiconductor region covers the bottom surface of the trench.

According to the subject matter of the appended claim 13, impurity ions of the second conductivity type are implanted in perpendicular to the surface of the first semiconductor region in the step (b).

The method of manufacturing a semiconductor device according to the subject matter of the appended claim 14 has the following specific features. First, a trench is formed in a first semiconductor region of a first conductivity type. Then, an oxide film having an arbitrary thickness is formed and an impurity of a first conductivity type is introduced into the surface portion of the first semiconductor region. Based on the thickness of the oxide film formed, the concentration of the impurity of the first conductivity type, the ion implantation angle, and the acceleration voltage of the ion implantation, the concentration of the impurity of the first conductivity type in the surface portion of the first semiconductor region exposed to the side wall of the trench excluding the corner portion of the trench is set to be high selectively.

After the step of introducing an impurity described above, a first electrode is formed in the trench with a first insulator film interposed between the side wall of the trench and the first electrode. Then, a control electrode is formed in the trench with a second insulator film interposed between the side wall of the trench and the control electrode. The control electrode is formed above the first electrode.

Then, the impurity of the first conductivity type introduced into the surface portion of the first semiconductor region is diffused to form a fifth semiconductor region of the first conductivity type which is doped more heavily than the first semiconductor region. The fifth semiconductor region is not so deep as to reach the corner portion of the trench.

According to the subject matter of the appended claim 15, impurity ions of the first conductivity type are implanted at an oblique angle between 45 degrees of angle and 80 degrees of angle to the surface of the first semiconductor region in the step (b).

According to the subject matter of the appended claim 16, the semiconductor device includes a silicon substrate working as the first semiconductor region.

According to the subject matter of the appended claim 17, the semiconductor device includes a silicon carbide substrate working as the first semiconductor region.

By arranging the fourth semiconductor region, only the impurity concentration in the portion of the first semiconductor region in the vicinity of the trench bottom surface is set to be low. By the impurity concentration setting, the impurity concentration in the region that will work as a channel region is set to be higher than the impurity concentration in the vicinity of the trench bottom surface. Therefore, the ON-state resistance is reduced. By lowering the impurity concentration in the vicinity of the trench bottom surface, the electric field in the vicinity of the trench bottom surface is relaxed.

Since the fourth semiconductor region facilitates lowering only the impurity concentration in the vicinity of the trench bottom surface, it is not necessary to provide the first semiconductor region with a double-layer epitaxial structure. Therefore, the portion of the first semiconductor region, in which the impurity concentration is low, is made to be narrower as compared with the case, in which the first semiconductor region is provide with a double-layer epitaxial structure. Due to this, the impurity concentration in the entire first semiconductor region is made to be higher than the impurity concentration in the entire drift region of the conventional semiconductor device which employs a double-layer epitaxial structure. Therefore, the ON-state resistance is reduced and the electric field in the vicinity of the trench bottom surface is relaxed more effectively as compared with the conventional vertical-field-plate-type semiconductor device (cf. FIG. 16).

Since it is not necessary to provide the first semiconductor region with a double-layer epitaxial structure, the conventional edge-termination structure is employable. Therefore, the manufacturing costs of a wafer, in which the semiconductor device is formed, are reduced.

According to the subject matter of the appended claim 4, the arrangement of the fifth semiconductor region facilitates setting the impurity concentration to be high in the portion of the first semiconductor region that will work as a channel region. The arrangement of the fifth semiconductor region facilitates increasing the carrier amount injected from the second semiconductor region to the first semiconductor region. Therefore, the ON-state resistance is reduced.

The fifth semiconductor region is not formed in the vicinity of the trench corner. Therefore, the impurity concentration in the portion of the first semiconductor region in the vicinity of the trench bottom surface is made to be lower than the impurity concentration in the portion of the first semiconductor region on the side of the second semiconductor region. Due to this, the electric field in the vicinity of the trench bottom surface is relaxed.

According to the subject matter of any of the appended claims 9 through 11, a trench is formed such that the angle between the bottom surface thereof and the corner portion thereof is obtuse. Further, an oblique ion implantation (the step of introducing an impurity) is conducted before forming a first electrode and a control electrode in the trench. Since the first and control electrodes formed in the trench work as masks, any impurity is not implanted any more, in the subsequent steps, into the impurity region formed through the step of introducing an impurity.

After the step of introducing an impurity, the impurity concentration in the portion of the first semiconductor region under the trench bottom surface is maintained at a value lower than the impurity concentrations in the other portions of the first semiconductor region. Therefore, the fourth semiconductor region, the impurity concentration thereof is lower than the impurity concentration in the first semiconductor region, is formed.

According to the subject matter of the appended claim 12 or 13, the step of introducing an impurity is conducted before the first and control electrodes are formed in the trench. Since the first and control electrodes formed in the trench work as masks, any impurity is not implanted any more, in the subsequent steps, into the impurity region formed through the step of introducing an impurity.

After the step of introducing an impurity, the impurity concentration in the portion of the first semiconductor region under the trench bottom surface is maintained at a value lower than the impurity concentrations in the other portions of the first semiconductor region. Therefore, the fourth semiconductor region, the impurity concentration thereof is lower than the impurity concentration in the first semiconductor region, is formed.

According to the subject matter of the appended claim 14 or 15, an oblique ion implantation (the step of introducing an impurity) is conducted before the first and control electrodes are formed in the trench. Since the first and control electrodes formed in the trench work as masks, any impurity is not implanted any more, in the subsequent steps, into the impurity region formed through the step of introducing an impurity.

After the step of introducing an impurity, the impurity concentration in the portion of the first semiconductor region on the side wall of the trench is maintained at a value higher than the impurity concentrations in the other portions of the first semiconductor region. Therefore, the fifth semiconductor region, the impurity concentration thereof is higher than the impurity concentration in the first semiconductor region, is formed.

The semiconductor device according to the invention and the method of manufacturing the semiconductor device according to the invention facilitate lowering the ON-state voltage, preventing the breakdown voltage from lowering, lowering the gate capacitance, and reducing the manufacturing costs.

BRIEF DESCRIPTIONS OF THE DRAWINGS

MODES FOR CARRYING OUT THE INVENTION

Figure 1:
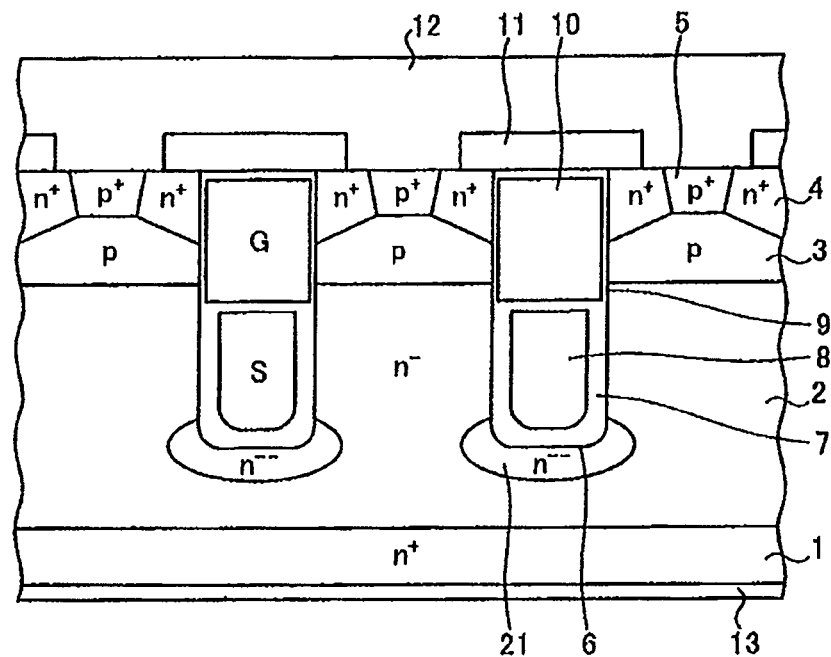
FIG. 1 is the cross sectional view of a semiconductor device according to a first embodiment of the invention.

Now the invention will be described in detail hereinafter with reference to the accompanied drawings which illustrate the preferred embodiments of the invention.

In the descriptions herein and the attached drawings, the n-type layer or the n-type region is a layer or a layer, in which electrons are majority carries. The p-type layer or the p-type region is a layer or a layer, in which holes are majority carries.

The suffix "+" on the shoulder of the letter "n" or "p" indicating the conductivity type of a layer or a region indicates that the layer or the region is doped relatively heavily. The suffix "−" on the shoulder of the letter "n" or "p" indicating the conductivity type of a layer or a region indicates that the layer or the region is doped relatively lightly.

In the following descriptions and the attached drawings, the same constituent elements are designated by the same reference numerals and their duplicated description are omitted for the sake of simplicity.

First Embodiment

FIG. 1 is the cross sectional view of a semiconductor device according to a first embodiment of the invention.

The semiconductor device shown in FIG. 1 is a MOSFET having a vertical field-plate structure (hereinafter referred to as a "vertical-field-plate-type MOSFET"). The vertical field-plate structure includes field plate (first electrode) 8 biased at a source potential and gate electrode (control electrode) 10, both buried in trench 6 formed in a semiconductor substrate. The semiconductor substrate includes $n^+$ drain region 1 and $n^-$ drift region (first semiconductor region) 2 on $n^+$ drain region 1. The semiconductor substrate may be a silicon (Si) substrate or a silicon carbide (SiC) substrate.

In detail, an active area, in which a vertical-field-plate-type MOSFET is formed, and an edge-termination area (not shown) surrounding the active area are arranged in $n^-$ drift region 2. The edge-termination area functions to improve the breakdown voltage of the active area. In the surface portion of $n^-$ drift region 2 in the active area on the first major surface side of the semiconductor substrate, p-type well region (second semiconductor region) 3 is formed. In the surface portion of p-type well region 3, $n^+$ source region (third semiconductor region) 4 and $p^+$ heavily doped region 5 are formed selectively. The impurity concentration in $p^+$ heavily doped region 5 is higher than the impurity concentration in p-type well region 3.

From the first major surface of the semiconductor substrate, trench 6 contacting with $n^+$ source region 4 and extended into $n^-$ drift region 2 is formed through p-type well region 3. Field plate 8 is disposed in trench 6 with first insulator film 7 interposed between field plate 8 and the trench 6 inner wall. Field plate 8 is connected electrically to source electrode 12. Gate electrode 10 is disposed above field plate 8 in trench 6 with second insulator film 9 interposed between gate electrode 10 and the trench 6 side wall.

In other words, field plate 8 is buried in the trench 6 bottom and gate electrode 10 is buried above field plate 8 in trench 6 with second insulator film 9 interposed between field plate 8 and gate electrode 10. The portion of second insulator film 9 on the trench 6 side wall works as a gate insulator film. The portion of second insulator film 9 between field plate 8 and gate electrode 10 works as a first interlayer insulator film that insulates field plate 8 and gate electrode 10 from each other.

Field plate 8 is positioned on the $n^-$ drift region 2 side of the boundary between $n^-$ drift region 2 and p-type well region 3. The portion of gate electrode 10 on the field plate 8 side is positioned on the $n^-$ drift region 2 side of the boundary between $n^-$ drift region 2 and p-type well region 3. In other words, gate electrode 10 is buried in trench 6 such that gate electrode 10 is extended from the first major surface of the semiconductor substrate into $n^-$ drift region 2. Due to the arrangements described above, the portion of p-type well region 3 under $n^+$ source region 4 adjoining to gate electrode 10 via second insulator film 9 is inverted in the ON-state of the device. Due to the inversion, an n-type channel region is formed in p-type well region 3 under $n^+$ source region 4 and in $n^-$ drift region 2.

In $n^-$ drift region 2, $n^{--}$ lightly doped region (fourth semiconductor region) 21 that crosses under the trench 6 bottom surface from the trench 6 corner portion is disposed. In other words, $n^{--}$ lightly doped region 21 is disposed under the trench 6 bottom surface such that lightly doped region 21 wider than trench 6 covers the trench 6 corner portion. The impurity concentration in lightly doped region 21 is lower than the impurity concentration in $n^-$ drift region 2. It is preferable for the impurity concentration in lightly doped region 21 to be 20% or more and 88% or less of the impurity concentration in $n^-$ drift region 2. By arranging $n^{--}$ lightly doped region 21 as described above, it is possible to set the impurity concentrations of $n^-$ drift region 2 under the bottom surface of trench 6 and in the corner portions thereof to be low. Due to the impurity concentration setting described above, the depletion layer expanding toward n$^+$ drain region 1 from the junction between p-type well region 3 and n$^-$ drift region 2 is liable to expansion in the vicinity of the trench 6 bottom surface. Therefore, the electric field in the vicinity of the trench 6 bottom surface is relaxed and the breakdown voltage of the active area is prevented from lowering.

First insulator film 7 is thicker than second insulator film (gate insulator film) 9. By setting first insulator film 7 to be thicker than second insulator film 9, the breakdown voltage of the active area may be maintained, even if the impurity concentration in n$^-$ drift region 2 is set to be low. Source electrode (second electrode) 12 is in contact with n$^+$ source region 4 and p$^+$ heavily doped region 5. Source electrode 12 is insulated from gate electrode 10 by second interlayer insulator film 11. On the n$^+$ drain region 1 surface, that is the second major surface of the semiconductor substrate, drain electrode 13 in contact with n$^+$ drain region 1 is formed.

FIGS. 2 through 7 are the cross sectional views of a semiconductor substrate describing the manufacturing steps for manufacturing the semiconductor device according to the first embodiment of the invention.

Figure 2:
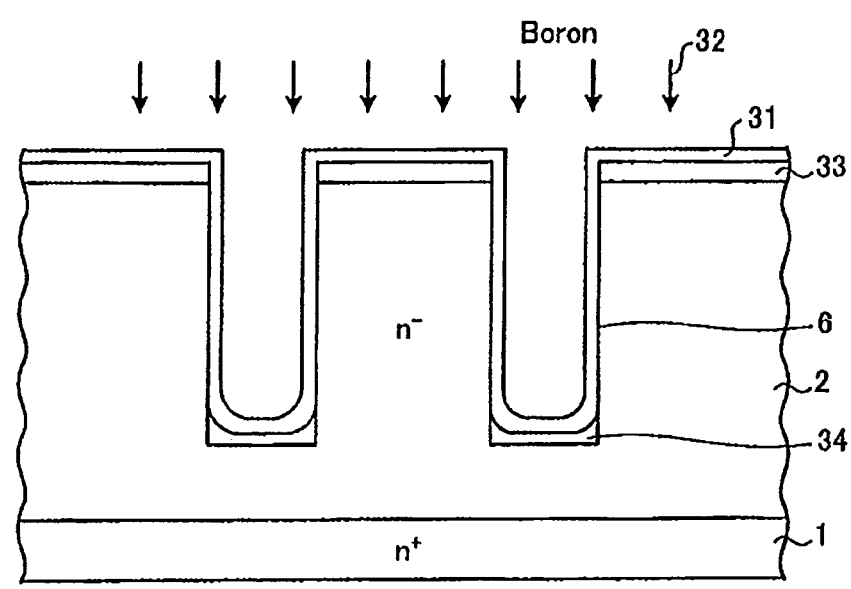
FIG. 2 is a first cross sectional view of a semiconductor substrate describing an initial step for manufacturing the semiconductor device shown in FIG. 1.

Referring now to FIG. 2, the step of forming a trench is conducted. In detail, trench 6 is formed from the n$^-$ drift region 2 side (first major surface side) of an n-type semiconductor substrate including n$^+$ drain region 1 and n$^-$ drift region 2 on n$^+$ drain region 1, e.g. by photolithography, into n$^-$ drift region 2. Trench 6 is not so deep as to reach n$^+$ drain region 1. The n-type semiconductor substrate may be formed by growing n$^-$ drift region 2 epitaxially on a substrate, that works as n$^+$ drain region 1.

Then, sacrifice oxide film (screen oxide film) 31 is formed, e.g. by a thermal treatment, on the first major surface of the n-type semiconductor substrate.

Then, the step of introducing an impurity is conducted. In detail, ion implantation 32 is conducted through sacrifice oxide film 31 in perpendicular to the first major surface of the n-type semiconductor substrate to introduce a p-type impurity such as boron (B) into the surface portion of n$^-$ drift region 2. Since ion implantation 32 is conducted in perpendicular to the first major surface of the n-type semiconductor substrate, the p-type impurity is implanted only into the surface of the region (the first major surface of the semiconductor substrate), in which trench 6 is not formed, and the trench 6 bottom surface. It is effective to set the dose amount of the p-type impurity to be $1\times10^{11}$ cm$^{-2}$ or more and $1\times10^{12}$ cm$^{-2}$ or less. By setting the p-type impurity dose amount as described above, the impurity concentration in n$^{--}$ lightly doped region 21 formed later may be set at a desired value.

In the step of introducing an impurity, the p-type impurity is introduced selectively into the surface portion of n$^-$ drift region 2 to lower the n-type impurity concentration in the surface portion of n$^-$ drift region 2 selectively. In other words, n-type first impurity region 33 is formed only in the surface portion of n$^-$ drift region 2, in which trench 6 is not formed, and n-type second impurity region 34 is formed only in the surface portion of n$^-$ drift region 2 exposed to the trench 6 bottom surface. First and second impurity regions 33 and 34 are doped more lightly than n$^-$ drift region 2. It is effective to set the dose amount of the p-type impurity to be $1\times10^{11}$ cm$^{-2}$ or more and $1\times10^{12}$ cm$^{-2}$ or less.

Figure 3:
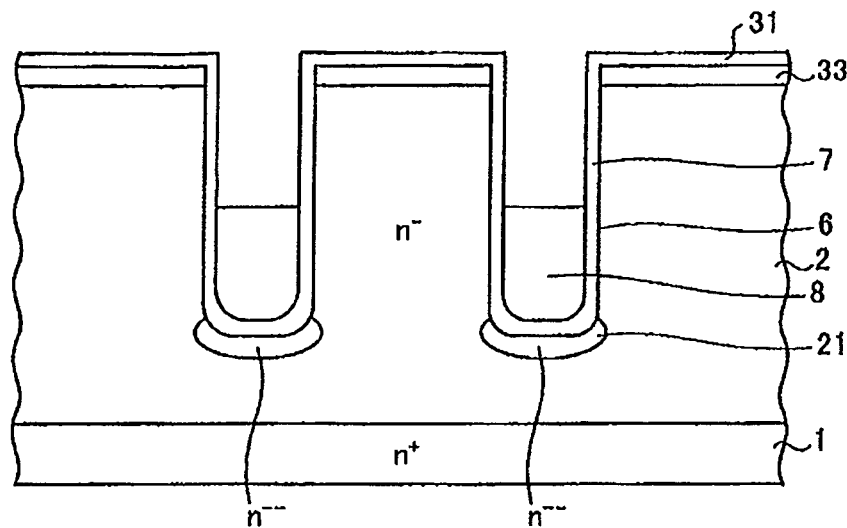
FIG. 3 is a second cross sectional view of the semiconductor substrate describing the step for manufacturing the semiconductor device subsequent to the step described in FIG. 2.
Figure 4:
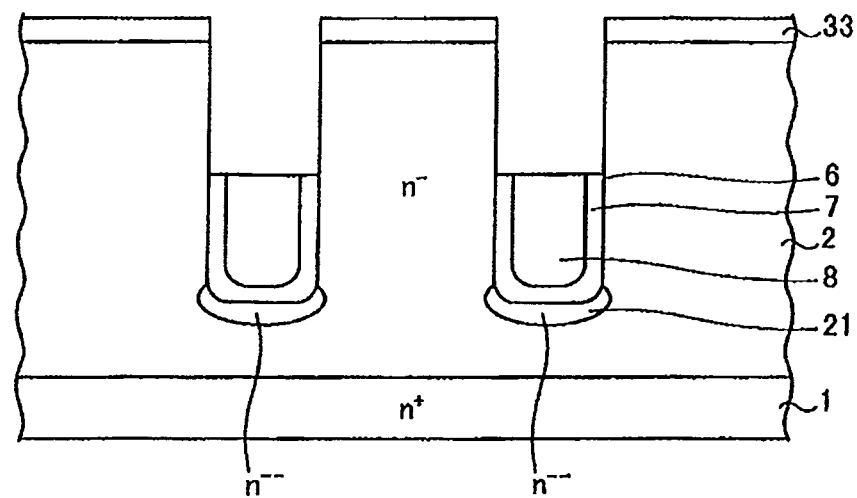
FIG. 4 is a third cross sectional view of the semiconductor substrate describing the step for manufacturing the semiconductor device subsequent to the step described in FIG. 3.

Then, the step of forming a first electrode is conducted. First, all the sacrifice oxide films 31 are removed (not illustrate). Then, first insulator film 7 is grown, e.g. by a thermal treatment, on the side wall and bottom surface of trench 6. First insulator film 7 is grown to be thicker than second insulator film 9 grown later. After burying polysilicon in trench 6, the polysilicon is etched back such that the polysilicon surface will be positioned more deeply than the boundary between n$^-$ drift region 2 and p-type well region 3. By the etching back, field plate 8 is formed on the bottom side of trench 6 as shown in FIG. 3.

Then, a sacrifice oxide film (not shown) is formed anew on the first major surface of the semiconductor substrate and the sacrifice oxide film is removed to flatten the field plate 8 surface. In association with the removal of the sacrifice oxide film, first insulator film 7 is etched back such that the portion of first insulator film 7 in contact with field plate 8 remains unremoved (cf. FIG. 4).

Figure 5:
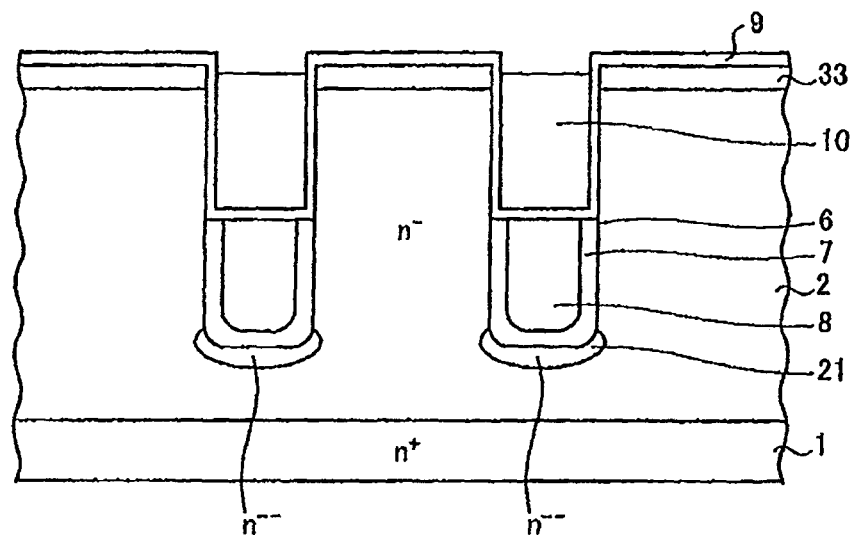
FIG. 5 is a fourth cross sectional view of the semiconductor substrate describing the step for manufacturing the semiconductor device subsequent to the step described in FIG. 4.

Then, the step of forming a control electrode is conducted. Second insulator film 9 is grown by a thermal treatment on the exposed trench 6 side wall and the exposed field plate 8 surface. Then, polysilicon is buried in trench 6 and the polysilicon is etched back (cf. FIG. 5). By the treatments of the polysilicon, gate electrode 10 is formed on the opening side of trench 6 as shown in FIG. 5. The step of flattening the field plate 8 surface is conducted, if necessary. The step of flattening the field plate 8 surface is not conducted sometimes.

Through the steps of forming field plate 8 and gate electrode 10, second n-type impurity region 34 formed through the step of introducing an impurity is diffused thermally by the thermal treatment for forming first and second insulator films 7 and 9 (the step of thermal diffusion). By the thermal diffusion, n$^{--}$ lightly doped region 21, crossing under the trench 6 bottom surface from the corner portion of trench 6 and covering the trench 6 bottom surface, is formed as shown in FIGS. 3 through 6. Alternatively, n$^{--}$ lightly doped region 21 may be formed by conducting a thermal treatment after the step of forming a control electrode.

Figure 6:
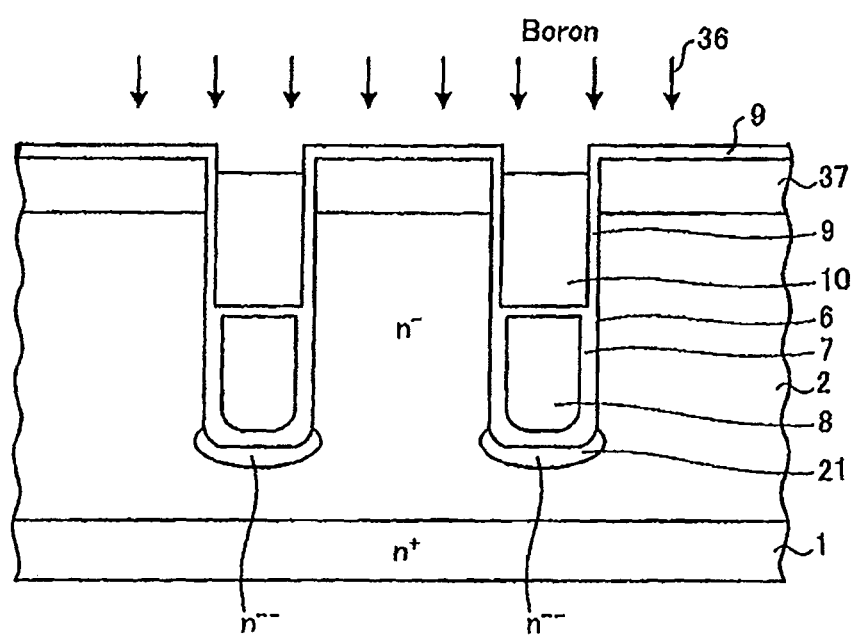
FIG. 6 is a fifth cross sectional view of the semiconductor substrate describing the step for manufacturing the semiconductor device subsequent to the step described in FIG. 5.

Then, ion implantation 36 is conducted through second insulator film 9 as shown in FIG. 6 to introduce a p-type impurity such as boron (B) in the surface portion on the first major surface side of the semiconductor substrate. In ion implantation 36, second insulator film 9 remaining on the first major surface side of the semiconductor substrate after polysilicon gate electrode 10 is etched back is utilized as a screen oxide film and gate electrode 10 is utilized as a mask. By the p-type impurity introduced, the n-type impurity in n-type first impurity region 33 is compensated, the p-type impurity concentration in impurity region 33 is raised, and p-type third impurity region 37 is formed. It is effective to set the p-type impurity dose amount to be $1\times10^{13}$ cm$^{-2}$ or more and $1\times10^{14}$ cm$^{-2}$ or less. By setting the p-type impurity dose amount as described above, p-type well region 3 is formed in the subsequent step at a desired impurity concentration.

Figure 7:
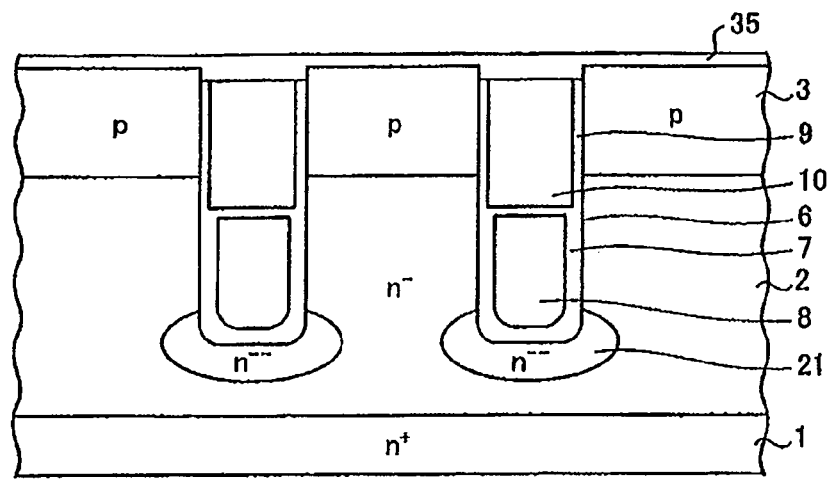
FIG. 7 is a sixth cross sectional view of the semiconductor substrate describing the step for manufacturing the semiconductor device subsequent to the step described in FIG. 6.

Then, p-type third impurity region 37 is diffused thermally to form p-type well region 3 as shown in FIG. 7. In forming p-type well region 3, second insulator film 9 remaining may be removed before the thermal diffusion and oxide film 35 having an arbitrary thickness may be formed in the thermal diffusion considering the range of the impurity ions implanted in the subsequent steps.

Then, n$^+$ source region 4 and p$^+$ heavily doped region 5 are formed selectively, e.g. by photolithography, in the surface portion of p-type well region 3. Then, second interlayer insulator film 11 is formed on the first major surface of the semiconductor substrate such that n$^+$ source region 4 and p$^+$ heavily doped region 5 are exposed and gate electrode 10 is covered. Then, source electrode 12, in contact with n$^+$ source region 4 and p$^+$ heavily doped region 5, is formed on the first major surface of the semiconductor substrate. Then, drain electrode 13, in contact with n$^+$ drain region 1, is formed on the second major surface of the semiconductor substrate.

Thus, the vertical-field-plate-type MOSFET shown in FIG. 1 is completed.

According to the first embodiment of the invention, the impurity concentration only in the portion of n⁻ drift region 2 in the vicinity of the trench 6 bottom surface is set to be low by the arrangement of n⁻⁻ lightly doped region 21. Since the impurity concentrations in the portions of n⁻ drift region 2, through which a current flows in the ON-state of the device, except the vicinity of the trench 6 bottom surface are set to be high, the ON-state resistance is reduced and the ON-state voltage is reduced. By setting the impurity concentration in the vicinity of the trench 6 bottom surface to be low, the electric field in the vicinity of the trench 6 bottom surface is relaxed. Therefore, the breakdown voltage in the active area is prevented from lowering.

Figure 16:
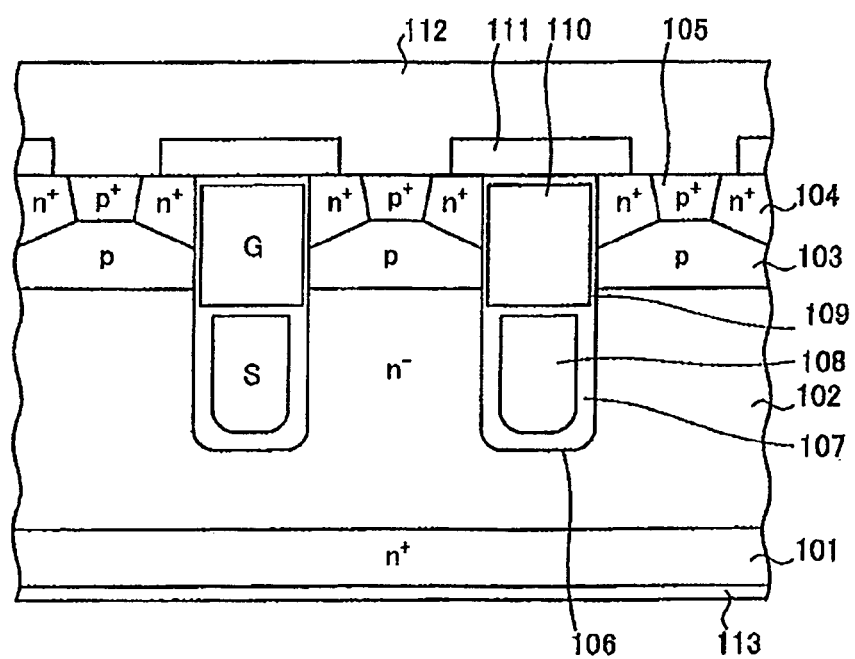
FIG. 16 is the cross sectional view of a conventional MOSFET having a vertical field-plate structure.

Since only the impurity concentration in the vicinity of the trench 6 bottom surface is set to be low due to the arrangement of n⁻⁻ lightly doped region 21, it is unnecessary to provide the drift region with a double-layer epitaxial structure. Therefore, the portion of n⁻ drift region 2, in which the impurity concentration is low, is narrowed as compared with the drift region provided with a double-layer epitaxial structure. According to the first embodiment of invention, the impurity concentration in the entire drift region is set to be higher than the impurity concentration in the entire drift region of the conventional semiconductor device which employs the double-layer epitaxial structure. Therefore, the ON-state resistance is reduced and the ON-state voltage is reduced according to the first embodiment as compared with the conventional vertical-field-plate-type MOSFET (cf. FIG. 16). Moreover, the electric field in the vicinity of trench 6 bottom surface is relaxed and the breakdown voltage in the active area is prevented from lowering according to the first embodiment. Since it is not necessary to provide the drift region with a double-layer epitaxial structure, it is possible to employ the conventional edge-termination structure. Therefore, the manufacturing costs of the wafer, in which a vertical-field-plate-type MOSFET is formed, are reduced.

The step of introducing an impurity is conducted before forming field plate 8 and gate electrode 10 in trench 6. Since field plate 8 and gate electrode 10 formed in trench 6 work as masks, any impurity is not implanted in the subsequent steps into n-type second impurity region 34 formed through the step of introducing an impurity. Therefore, the impurity concentration in n-type second impurity region 34 is maintained at a value lower than the impurity concentration in n⁻ drift region 2 after the step of introducing an impurity. Therefore, it is possible to form n⁻⁻ lightly doped region 21, the impurity concentration thereof is lower than the impurity concentration in n⁻ drift region 2. Although the impurity concentration in n⁻ drift region 2 is different depending on the breakdown voltage class, the impurity concentration in n⁻ drift region 2 according to the first embodiment in the breakdown voltage class of 100 V is from $3.0 \times 10^{15}/cm^3$ to $10.0 \times 10^{15}/cm^3$.

Second Embodiment

Figure 8:
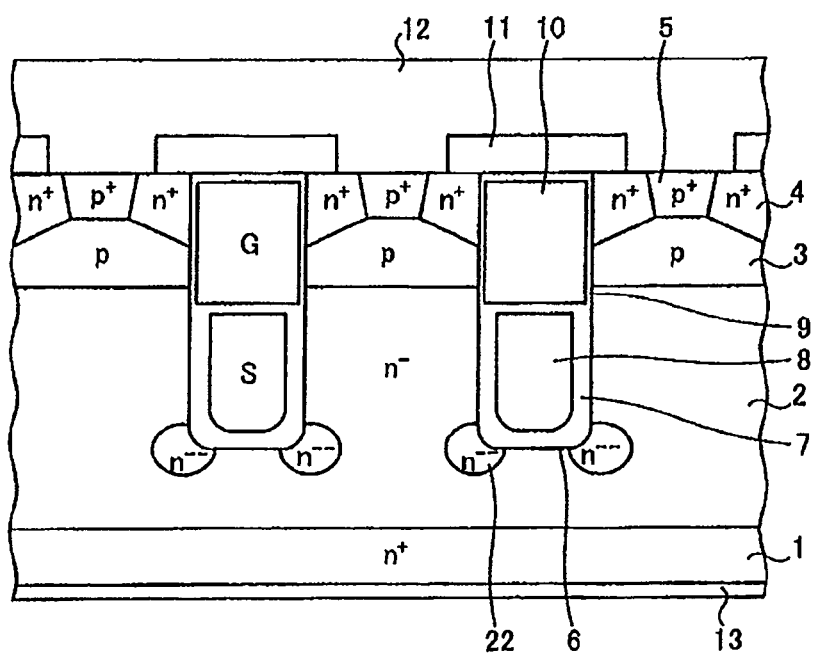
FIG. 8 is the cross sectional view of a semiconductor device according to a second embodiment of the invention.

FIG. 8 is the cross sectional view of a semiconductor device according to a second embodiment of the invention.

The n⁻⁻ lightly doped region may be arranged only in the corner portion of trench 6 in the semiconductor device according to the first embodiment.

According to the second embodiment, lightly doped region (fourth semiconductor region) 22 covers only the corner portion of trench 6 as shown in FIG. 8. In other words, the impurity concentration of n⁻ lightly doped region 2 in the corner portion of trench 6 is reduced. Due to the impurity concentration setting, a depletion layer is made to expand easily, in the same manner as according to the first embodiment, in the vicinity of the trench 6 corner portion, to which the electric field is liable to localize. Therefore, the electric field in the vicinity of the trench 6 corner portion is relaxed and the breakdown voltage in the active area is prevented from lowering. The other structures are the same with those according to the first embodiment.

Figure 9:
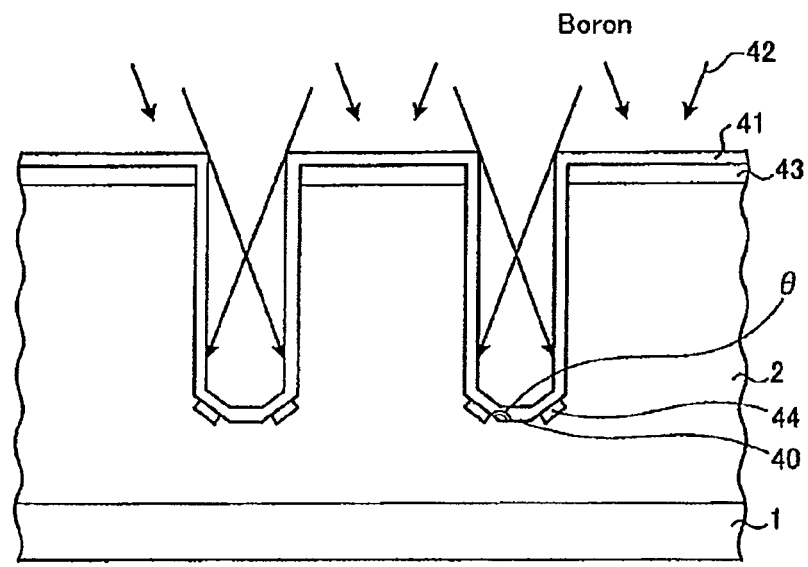
FIG. 9 is a first cross sectional view of a semiconductor substrate describing an initial step for manufacturing the semiconductor device shown in FIG. 8.
Figure 10:
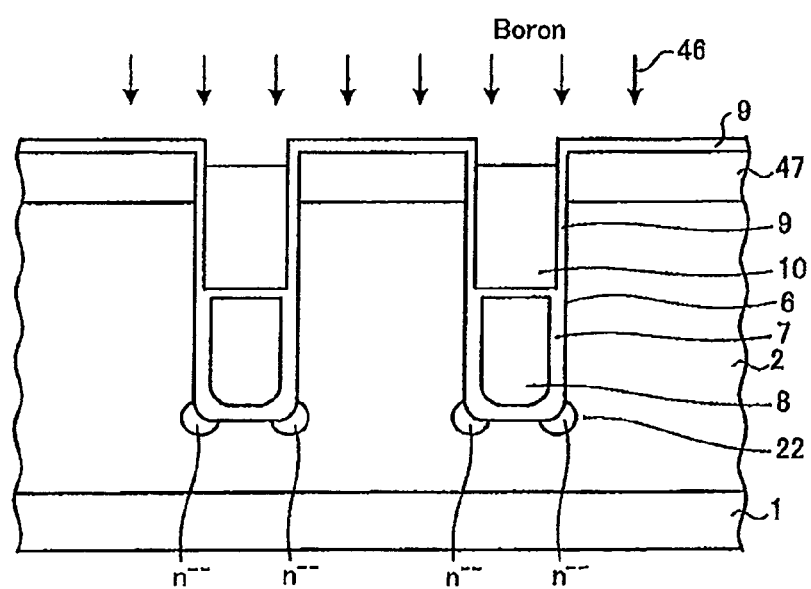
FIG. 10 is a second cross sectional view of the semiconductor substrate describing the step for manufacturing the semiconductor device subsequent to the step described in FIG. 9.
Figure 11:
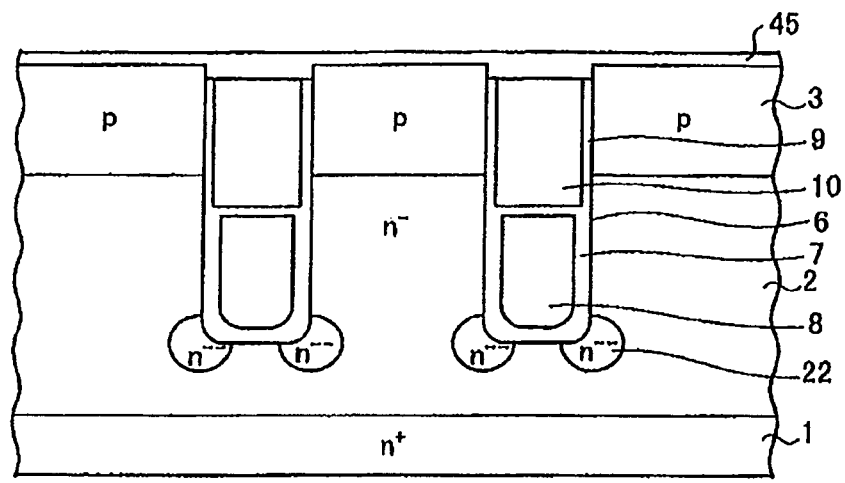
FIG. 11 is a third cross sectional view of the semiconductor substrate describing the step for manufacturing the semiconductor device subsequent to the step described in FIG. 10.

FIGS. 9 through 11 are the cross sectional views of a semiconductor substrate describing the manufacturing steps for manufacturing the semiconductor device according to the second embodiment of the invention. First, the step of forming a trench is conducted. As shown in FIG. 9, trench 40 is formed from the n⁻ drift region 2 side (first major surface side) of an n-type semiconductor substrate, e.g. by photolithography. Trench 40 is not so deep as to reach n⁺ drain region 1. Trench 40 is formed such that the angle θ between the trench 40 bottom surface and the trench 40 corner portion is obtuse. It is preferable for the angle θ between the trench 40 bottom surface and the trench 40 corner portion to be from 120 degrees of angle to 150 degrees of angle. The reason for this will be described later.

In the same manner as according to the first embodiment, sacrifice oxide film 41 is formed on the first major surface of the semiconductor substrate. Then, the step of introducing an impurity is conducted. Ion implantation 42 is conducted obliquely (hereinafter referred to as "oblique ion implantation 42") through sacrifice oxide film 41 to the first major surface of the semiconductor substrate to introduce a p-type impurity such as boron (B) into the surface portion of n⁻ drift region 2. Here, it is preferable to conduct oblique ion implantation 42 at an oblique angle between 65 and 80 degrees of angles to the first major surface of the n-type semiconductor substrate.

As described above, the angle θ between the trench 40 bottom surface and the trench 40 corner portion is obtuse. By conducting oblique ion implantation 42 in the step of introducing an impurity, p-type impurity ions are implanted only into the surface portion of n⁻ drift region 2, in which trench 6 is not formed (the first major surface of the semiconductor substrate), and the corner portion of trench 40. In other words, any p-type impurity ion is not implanted into the bottom surface of trench 40.

Therefore, the n-type impurity concentration in the surface portion of n⁻ drift region 2 is set to be low selectively. Therefore, it is possible to form n-type first and second impurity regions 43 and 44, the impurity concentrations thereof are lower than the impurity concentration in n⁻ drift region 2.

In the step of introducing an impurity, it is effective to conduct oblique ion implantation 42 by changing the angle θ between the trench 40 bottom surface and the trench 40 corner portion, the sacrifice oxide film 41 thickness, the implantation angle of oblique ion implantation 42, and the p-type impurity range based on the acceleration voltage of oblique ion implantation 42 variously. The p-type impurity dose is the same with the p-type impurity dose according to the first embodiment. By these settings, n⁻⁻ lightly doped region 22 formed in the subsequent step is formed at a desired impurity concentration.

Then, all the sacrifice oxide films 41 are removed, although not illustrated. Then, the step of forming a first electrode and the step of forming a control electrode are conducted in the same manner as according to the first embodiment. As shown in FIG. 10, first insulator film 7, field plate 8, second insulator film 9, and gate electrode 10 are formed. By the etching for removing sacrifice oxide film 41, the angle θ between the trench 40 bottom surface and the trench 40 corner portion is widened, the trench 40 corner is shape with an arc, and trench 6 is formed.

Then, the step of diffusion is conducted. By the thermal treatment for forming first insulator film 7 and second insulator film 9, impurity region 44 formed through the step of introducing an impurity is diffused thermally in the same manner as impurity region 34 according to the first embodiment and $n^{--}$ lightly doped region 22 covering the trench 6 corner portion is formed. Alternatively, $n^{--}$ lightly doped region 22 may be formed by conducting a thermal diffusion after the step of forming a control electrode.

Then, ion implantation 46 is conducted as shown in FIG. 10 through second insulator film 9 formed anew on the first major surface of the semiconductor substrate to introduce a p-type impurity such as boron (B) into the surface portion on the first major surface side of the semiconductor substrate in the same manner as according to the first embodiment. The n-type impurity in n-type first impurity region 43 is compensated by the p-type impurity, the p-type impurity concentration in impurity region 43 is raise, and p-type third impurity region 47 is formed. Then, p-type third impurity region 47 is diffused thermally to form p-type well region 3 as shown in FIG. 11. The subsequent steps are conducted in the same manner as according to the first embodiment to complete the vertical-field-plate-type MOSFET shown in FIG. 8. The other manufacturing techniques and conditions are the same with those according to the first embodiment.

According to the second embodiment, the effects the same with the effects obtained according to the first embodiment are obtained. According to the second embodiment, trench 40, in which the angle θ between the bottom surface thereof and the corner portion thereof is obtuse, is formed. According to the second embodiment, oblique ion implantation 42 (the step of introducing an impurity) is conducted before forming field plate 8 and gate electrode 10 in trench 40.

Since field plate 8 and gate electrode 10 formed in trench 40 work as masks, any impurity ion is not implanted through the subsequent steps into second impurity region 44 formed in the step of introducing an impurity. Therefore, the impurity concentration in second impurity region 44 is maintained at a value lower than the impurity concentration in $n^-$ drift region 2 after the step of introducing an impurity. Thus, $n^{--}$ lightly doped region 22, the impurity concentration thereof is lower than the impurity concentration in $n^-$ drift region 2, is formed.

Third Embodiment

Figure 12:
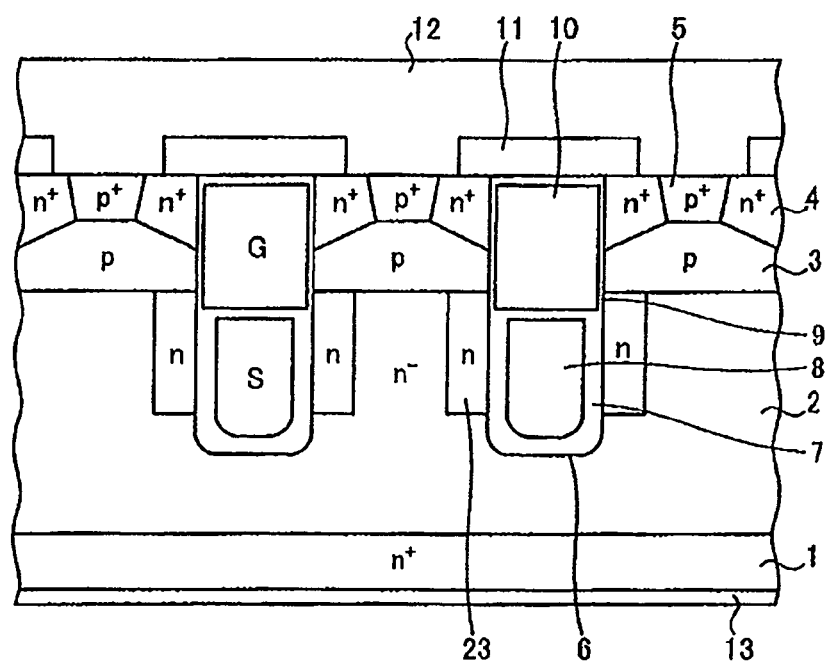
FIG. 12 is the cross sectional vieww of a semiconductor device according to a third embodiment of the invention.

FIG. 12 is the cross sectional view of a semiconductor device according to a third embodiment of the invention. An n-type heavily doped region may be disposed in $n^-$ drift region 2 instead of the $n^{--}$ lightly doped region covering the trench bottom surface in the semiconductor device according to the first embodiment.

As shown in FIG. 12, n-type heavily doped region (fifth semiconductor region) 23 is formed on the p-type well region 3 side of the trench 6 corner portion in $n^-$ drift region 2. The impurity concentration in n-type heavily doped region 23 is higher than the impurity concentration in $n^-$ drift region 2. It is preferable for the impurity concentration in n-type heavily doped region 23 to be between 114% and 500% of the impurity concentration in $n^-$ drift region 2. It is effective for n-type heavily doped region 23 to be adjoining to field plate 8 and gate electrode 10 via first insulator film 7 and second insulator film 9 formed on the trench 6 side wall.

By disposing n-type heavily doped region 23 as described above, it is possible to set the impurity concentration in the portion of $n^-$ drift region 2 between the p-type well region 3 and the trench 6 corner portion to be high. The n-type heavily doped region 23 is a region, in which many currents flow in the ON-state of the device. In other words, the ON-state resistance in $n^-$ drift region 2 is reduced. Any n-type heavily doped region 23 is not formed under the trench 6 bottom surface nor in the trench 6 corner portion. Therefore, the impurity concentrations in the portions of $n^-$ drift region 2 under the trench 6 bottom surface and in the trench 6 corner portion are unchanged. Therefore, the breakdown voltage in the active area is maintained. The other structures are the same with those in the semiconductor device according to the first embodiment.

Figure 13:
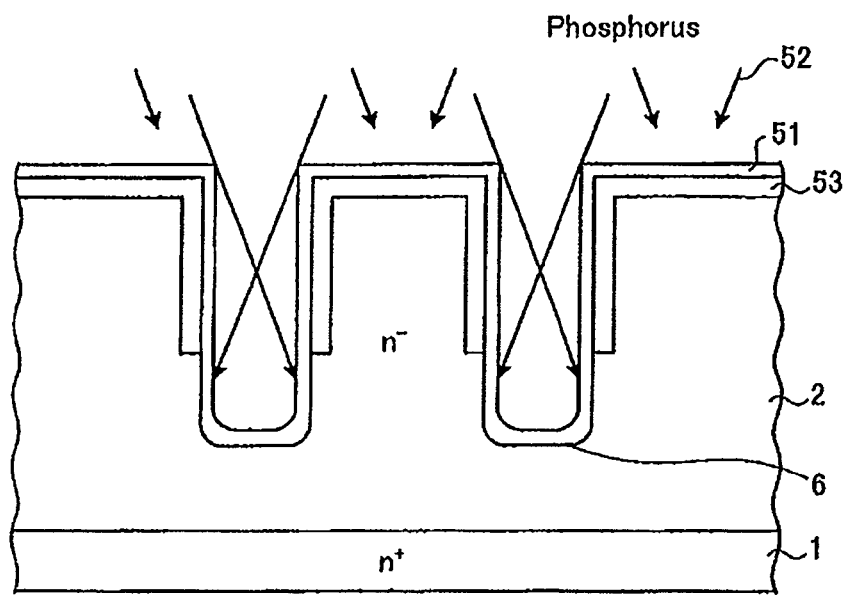
FIG. 13 is a first cross sectional view of a semiconductor substrate describing an initial step for manufacturing the semiconductor device shown in FIG. 12.
Figure 14:
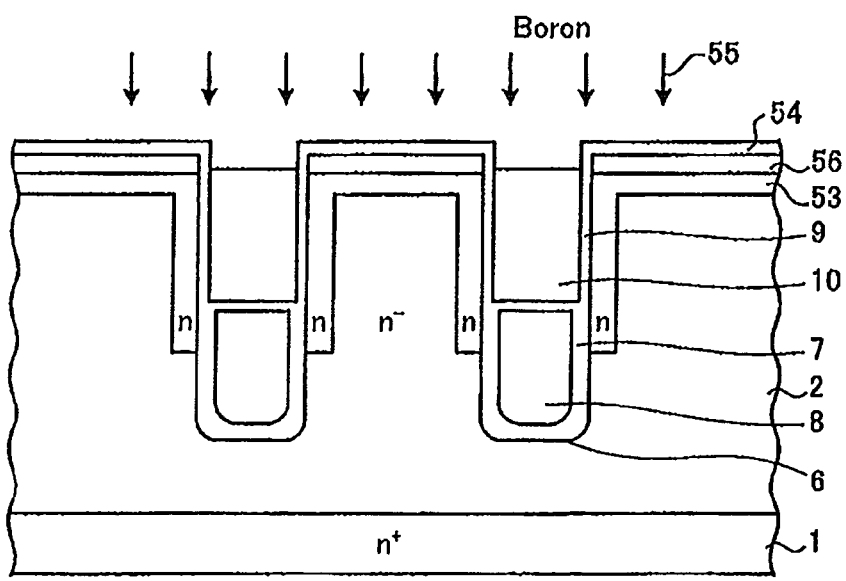
FIG. 14 is a second cross sectional view of the semiconductor substrate describing the step for manufacturing the semiconductor device subsequent to the step described in FIG. 13.
Figure 15:
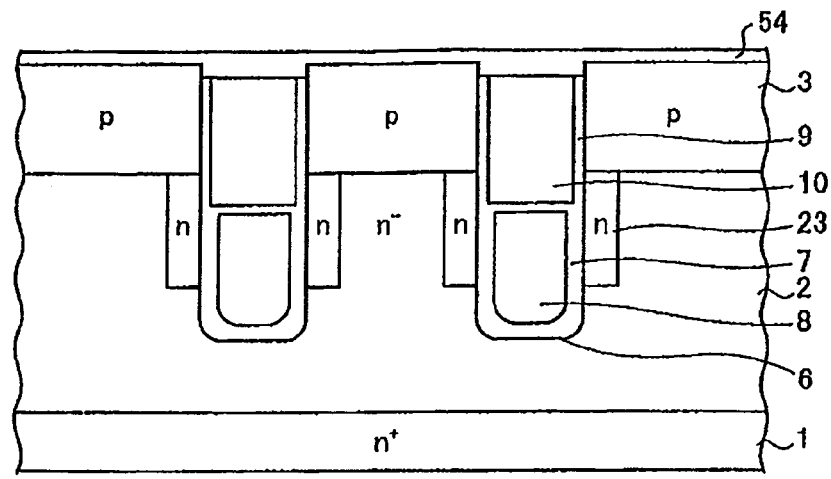
FIG. 15 is a third cross sectional view of the semiconductor substrate describing the step for manufacturing the semiconductor device subsequent to the step described in FIG. 14.

FIGS. 13 through 15 are the cross sectional views of a semiconductor substrate describing the manufacturing steps for manufacturing the semiconductor device according to the third embodiment of the invention.

First, the step of forming a trench is conducted. As shown in FIG. 13, trench 6 is formed in an n-type semiconductor substrate in the same manner as according to the first embodiment. Then, sacrifice oxide film 51 is formed on the first major surface of the semiconductor substrate in the same manner as according to the first embodiment.

Then, the step of introducing an impurity is conducted. Oblique ion implantation 52 is conducted through sacrifice oxide film 51 to introduce an n-type impurity such as phosphorus (P) into the surface portion of $n^-$ drift region 2. It is preferable for the oblique ion implantation 52 angle to the first major surface of the semiconductor substrate to be 45 degrees of angle or more and 80 degrees of angle or less.

By conducting oblique ion implantation 52 in the step of introducing an impurity, n-type impurity ions are implanted only into the surface portion of $n^-$ drift region 2, in which trench 6 is not formed (the first major surface of the semiconductor substrate), and into the side wall of trench 6 except the corner portion thereof. In other words, any n-type impurity ion is not implanted into the bottom surface of trench 6 nor the corner portion thereof. By oblique ion implantation 52, the n-type impurity concentration in the surface portion of $n^-$ drift region 2 is made to be high selectively. Therefore, n-type fourth impurity region 53, the impurity concentration thereof is higher than the impurity concentration in $n^-$ drift region 2, is formed only in the portion of $n^-$ drift region 2 exposed to the trench 6 side wall.

In the step of introducing an impurity, it is effective to conduct oblique ion implantation 52 by changing the trench 6 width, the sacrifice oxide film 51 thickness, the implantation angle of oblique ion implantation 52, and the n-type impurity range based on the acceleration voltage of oblique ion implantation 52 variously. It is preferable to set the dose amount of the n-type impurity to be $1 \times 10^{11}$ cm$^{-2}$ or more and $1 \times 10^{13}$ cm$^{-2}$ or less. By setting the n-type impurity dose amount as described above, the impurity concentration in n-type heavily doped region 23 formed later may be set at a desired value.

Then, all the sacrifice oxide films 51 are removed, although not illustrated. Then, the step of forming a first electrode and the step of forming a control electrode are conducted in the same manner as according to the first embodiment. As shown in FIG. 14, first insulator film 7, field plate 8, second insulator film 9, and gate electrode 10 are formed.

Then, the step of diffusion is conducted. By the thermal treatment for forming first insulator film 7 and second insulator film 9, fourth impurity region 53 formed through the step of introducing an impurity is diffused thermally in the same manner as according to the first embodiment. Fourth impurity region 53 is converted to n-type heavily doped region 23 in the subsequent step. Alternatively, n-type heavily doped region 23 may be formed by conducting a thermal diffusion after the step of forming a control electrode.

Then, ion implantation 55 is conducted through oxide film 54 formed anew on the first major surface of the semiconductor substrate as described in FIG. 14 to introduce a p-type impurity such as boron (B) into the surface portion on the first major surface side of the semiconductor substrate in the same manner as according to the first embodiment. On the first major surface side of the semiconductor substrate, the n-type impurity in n-type fourth impurity region 53 is compensated by the p-type impurity, the p-type impurity concentration in impurity region 53 is raise, and p-type fifth impurity region 56 is formed. It is preferable to set the dose amount of the p-type impurity to be $1 \times 10^{13}$ cm$^{-2}$ or more and $1 \times 10^{14}$ cm$^{-2}$ or less. By setting the p-type impurity dose amount as described above, the impurity concentration in p-type well region 3 formed in the subsequent step may be set at a desired value.

Then, fifth impurity region 56 is diffused thermally to form p-type well region 3 as shown in FIG. 15. As a result, fourth impurity region 53 remains as n-type heavily doped region 23 only on the side wall of trench 6 excluding the corner portion thereof. The subsequent steps are conducted in the same manner as according to the first embodiment to complete the vertical-field-plate-type MOSFET shown in FIG. 12. The other manufacturing techniques and conditions are the same with those according to the first embodiment.

According to the third embodiment, the effects the same with the effects obtained according to the first embodiment are obtained. By arranging n-type heavily doped region 23 as described above, the resistance in the portion of the n⁻ drift region 2, in which many currents flow in the ON-state of the device, is reduced. The portion of the n⁻ drift region 2, in which many currents flow in the ON-state of the device, is n-type heavily doped region 23. As a result, the ON-state resistance of the device is reduced. Therefore, it is possible to reduce the ON-state voltage of the device. Any n-type heavily doped region 23 is not arranged in the portion of the n⁻ drift region 2 between the trench 6 corner portion and n⁺ drain region 1.

Therefore, the impurity concentrations in the portion of n⁻ drift region 2 in the vicinity of the trench 6 bottom surface is lower than the impurity concentration in n-type heavily doped region 23. Therefore, the breakdown voltage in the active area is maintained without raising the electric field in the vicinity of the trench 6 bottom surface.

Oblique ion implantation 52, that is the step of introducing an impurity, is conducted before forming field plate 8 and gate electrode 10 in trench 6. Since field plate 8 and gate electrode 10 formed in trench 6 work as masks, any impurity is not implanted, in the subsequent steps, into fourth impurity region 53 formed through the step of introducing an impurity. Therefore, the impurity concentration in fourth impurity region 53 is maintained at a value higher than the impurity concentration in n⁻ drift region 2 after the step of introducing an impurity. Therefore, n-type heavily doped region 23, the impurity concentration thereof is higher than the impurity concentration in n⁻ drift region 2, is formed.

Although the invention has been described so far in connection with an n-channel MOSFET, the conductivity types may be inverted to each other. The invention is applicable to semiconductor devices such as an IGBT having a trench-gate structure. In that case, field plate 8 is disposed as an electrode (first electrode) biased at an emitter potential. Although it depends on the breakdown voltage class, the impurity concentration in n⁻ drift region 2 is from $2.5 \times 10^{15}$/cm$^3$ to $5 \times 10^{15}$ cm/cm$^3$ for the breakdown voltage class of 100 V.

INDUSTRIAL APPLICABILITY

The semiconductor device according to the invention is useful for power semiconductor devices and the method of manufacturing the semiconductor device according to the invention is useful for manufacturing power semiconductor devices.

What is claimed is:

1. A semiconductor device comprising;
   a first semiconductor region of a first conductivity type;
   a second semiconductor region of a second conductivity type disposed on the first semiconductor region;
   a third semiconductor region of the first conductivity type disposed selectively on the second semiconductor region;
   a trench extending through the third and second semiconductor regions and into the first semiconductor region;
   a first electrode disposed in the trench with a first insulator film interposed between a side wall of the trench and the first electrode, the first electrode being located in a bottom portion of the trench;
   a control electrode disposed in the trench with a second insulator film interposed between the side wall of the trench and the control electrode, the control electrode being located above the first electrode;
   a second electrode in contact with the third semiconductor region; and
   a fourth semiconductor region of the first conductivity type covering a corner portion of the trench, the fourth semiconductor region being doped more lightly than the first semiconductor region,
   wherein the first electrode is positioned on a first semiconductor region side of a boundary between the first semiconductor region and the second semiconductor region,
   wherein the first electrode is connected electrically to the second electrode, and
   wherein the first insulator film is thicker than the second insulator film.

2. The semiconductor device according to claim 1, wherein the fourth semiconductor region crosses under the bottom of the trench from the corner portion of the trench such that the fourth semiconductor region covers the bottom of the trench.

3. The semiconductor device according to claim 1, wherein an impurity concentration in the fourth semiconductor region is 20% or more and 88% or less of an impurity concentration in the first semiconductor region.

4. The semiconductor device according to claim 1, wherein the semiconductor device is fabricating on a silicon substrate.

5. The semiconductor device according to claim 1, wherein the semiconductor device is fabricated on a silicon carbide substrate.

* * * * *